US012732142B2

(12) United States Patent
Seebacher et al.

(10) Patent No.: US 12,732,142 B2
(45) Date of Patent: Sep. 8, 2026

(54) RADIO TRANSMITTER

(71) Applicant: Cypress Semiconductor Corporation, San Jose, CA (US)

(72) Inventors: David Seebacher, Villach (AT); Fabio Padovan, Villach (AT); Davide Ponton, Villach (AT); Dmytro Cherniak, Villach (AT)

(73) Assignee: Infineon Technologies Americas Corp., El Segundo, CA (US)

( * ) Notice: Subject to any disclaimer, the term of this patent is extended or adjusted under 35 U.S.C. 154(b) by 515 days.

(21) Appl. No.: 18/478,847

(22) Filed: Sep. 29, 2023

(65) Prior Publication Data

US 2024/0313717 A1 Sep. 19, 2024

Related U.S. Application Data

(60) Provisional application No. 63/490,245, filed on Mar. 14, 2023.

(51) Int. Cl.

*H03F 3/24* (2006.01)
*H03F 1/56* (2006.01)
*H04B 1/04* (2006.01)

(52) U.S. Cl.

CPC ............. *H03F 3/245* (2013.01); *H03F 1/565* (2013.01); *H04B 1/04* (2013.01); *H03F 2200/387* (2013.01)

(58) Field of Classification Search

CPC .... H03F 3/245; H03F 1/565; H03F 2200/387; H03F 3/2173; H03F 2200/451; H04B 1/04; H04B 2001/045; H03M 1/804

See application file for complete search history.

(56) References Cited

U.S. PATENT DOCUMENTS

2015/0097620 A1* 4/2015 Adamski ............... H03F 3/2171 330/251
2018/0097486 A1* 4/2018 Salem ....................... H03F 3/72
2020/0195199 A1* 6/2020 Cannella ............... H03F 1/0277
2021/0067113 A1* 3/2021 Chang ................. H03F 3/45183

(Continued)

OTHER PUBLICATIONS

A. Passamani, et al., A. Passamani, D. Ponton, E. Thaller, G. Knoblinger, A. Neviani and A. Bevilacqua, "13.9 A 1.1V 28.6dBm fully integrated digital power amplifier for mobile and wireless applications in 28nm CMOS technology with 35% PAE," 2017 IEEE International Solid-State Circuits Conference (ISSCC), San Francisco, CA, USA, 2017, pp. 232-233, doi: 10.1109/ISSCC.2017.7870346.

(Continued)

*Primary Examiner* — Angelica Perez

(57) ABSTRACT

A method may include designating selected stages of a power amplifier as active stages. Each active stage includes a tristate inverter having a high side switch and a low side switch connected to the high side switch at a drain node; and a capacitor connected in series with the tristate inverter. The method includes enabling a high side switch of an active stage in a high side state, enabling a low side switch of the active stage in a low side state, and disabling the high side switch and the low side switch while in a floating state while transitioning from at least one of the high side state to the low side state or the low side state to the high side state.

20 Claims, 5 Drawing Sheets

(56) References Cited

U.S. PATENT DOCUMENTS

2025/0070723 A1* 2/2025 He ........................ H03F 3/2171
2025/0112650 A1* 4/2025 Seebacher ................ H04B 1/04

OTHER PUBLICATIONS

J. Zanen, et al., J. Zanen, E. Klumperink and B. Nauta, "Analysis of Switched Capacitor Losses in Polar and Quadrature Switched Capacitor PAs," in IEEE Transactions on Circuits and Systems II: Express Briefs, vol. 67, No. 10, pp. 1904-1908, Oct. 2020, doi: 10.1109/TCSII.2019.2957576.
D. Seebacher, et al., D. Seebacher, W. Bösch, M. Gadringer, P. Singerl and C. Schuberth, "High frequency Class-DE push/pull power amplifier utilizing a parallel compensation inductance," 2014 Microelectronic Systems Symposium (MESS), Vienna, Austria, 2014, pp. 1-4, doi: 10.1109/MESS.2014.7010259.
A. Passamani, et al., A. Passamani, D. Ponton, G. Knoblinger and A. Bevilacqua, "A linear model of efficiency for Switched-Capacitor RF Power-Amplifiers," 2014 10th Conference on Ph.D. Research in Microelectronics and Electronics (PRIME), Grenoble, France, 2014, pp. 1-4, doi: 10.1109/PRIME.2014.6872748.
E. Hager, et al., E. Hager, T. Buckel, S. Schmickl, A. Passamani, H. Pretl and A. Springer, "A Quadrature Switched-Capacitor RF-DAC Drain Efficiency Model for Back-Off Operation," 2018 Austrochip Workshop on Microelectronics (Austrochip), Graz, Austria, 2018, pp. 27-31, doi: 10.1109/Austrochip.2018.8520708.
A. Passamani, et al., A. Passamani, D. Ponton, A. Wolter, G. Knoblinger and A. Bevilacqua, "A 28nm Low-Voltage Digital Power-Amplifier for QAM-256 WIFI Applications in 0.5mm2 Area w/ 2D Digital-Pre-Distortion and Package Combiner," 2018 25th IEEE International Conference on Electronics, Circuits and Systems (ICECS), Bordeaux, France, 2018, pp. 21-24, doi: 10.1109/ICECS.2018.8617936.
D. C. Hamill, D. C. Hamill, "Class DE inverters and rectifiers for DC-DC conversion," PESC Record. 27th Annual IEEE Power Electronics Specialists Conference, Baveno, Italy, 1996, pp. 854-860 vol.1, doi: 10.1109/PESC.1996.548681.
X. Luo, et al., X. Luo, H. J. Qian, Y. Yin and H. Xu, "Empowering Multifunction: Digital Power Amplifiers, the Last RF Frontier of the Analog and Digital Kingdoms," in IEEE Microwave Magazine, vol. 21, No. 12, pp. 47-67, Dec. 2020, doi: 10.1109/MMM.2020.3023221.

* cited by examiner

100
HOST INTERFACE 105
PROCESSOR 110
MODEM
MODULATOR 130
DEMODULATOR 135
115
TRANSCEIVER
TRANSMITTER 140
RECEIVER 145
T-R SWITCH 150
120
125

125
TRANSMIT SIGNAL
205
CONTROL UNIT 210
SCPA
205I
205C
205S
MNET
205M
215
LOAD
RL

TSH
TSL
SH
SL
Vd
300
305
205I

400
Low Power „ON slices“
Medium Power „ON slices“
High Power „ON slices“
$I_S$
$I_{SH}$
$I_{SL}$
$I_C$
$I_{CH}+I_{CL}$
$V_D$
$V_{DC}$
H
TRI
L
$\theta_1$
$\pi$
$\pi+\theta_1$
$2\pi$
$\theta$
415
410
405

600P
605
$T_R$
R
610
600
600I
600C
$C_0$
$C_1$
$C_2$
$C_N$
$V_P$
$V_N$
600N
600C
600I 500
500I
500C
500S
$C_0$
$C_1$
$C_2$
$C_N$
$T_R$
505
510

RADIO TRANSMITTER

RELATED APPLICATION(S)

This application claims priority to U.S. Provisional 63/490,245 filed on Mar. 14, 2023 the entirety of which is hereby incorporated by reference herein.

TECHNICAL FIELD

The present disclosure relates to the field of communications, and more particularly to transmitter power amplifier.

BACKGROUND

Power amplifiers generate transmission signals for radios. Switched capacitor power amplifiers have stages that operate in parallel to amplify the transmit signal.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a transmitter comprises a power amplifier comprising stages and configured to amplify a transmit signal to generate an amplified signal with an output power according to a number of active stages, each stage comprising a tristate inverter comprises a high side switch and a low side switch connected to the high side switch at a drain node, and a capacitor connected in series with the tristate inverter, and a control unit configured to designate selected stages of the power amplifier as the active stages, enable a high side switch of an active stage in a high side state, enable a low side switch of the active stage in a low side state, and disable the high side switch and the low side switch while in a floating state while transitioning from at least one of the high side state to the low side state or the low side state to the high side state.

In an embodiment, a radio comprises an antenna port, a modem configured to generate a transmit signal, a transmit-receive switch connected to the antenna port, a receiver connected to the transmit-receive switch, and a transmitter connected to the transmit-receive switch and comprising a power amplifier comprising stages and configured to amplify the transmit signal to generate an amplified signal with an output power according to a number of active stages, each stage comprises a tristate inverter comprises a high side switch and a low side switch connected to the high side switch at a drain node, and a capacitor connected in series with the tristate inverter, and a control unit configured to designate selected stages of the power amplifier as the active stages, configure a tristate inverter of an active stage in a high side state for a first phase interval, configure the tristate inverter of the active stage in a floating state for a second phase interval, configure the tristate inverter of the active stage in a low side state for a third phase interval, and configure the tristate inverter of the active stage in the floating state for a fourth phase interval, and a processor configured to control the transmit-receive switch to toggle between a transmit mode, wherein the transmitter is connected to an antenna at the antenna port, and a receive mode, wherein the receiver is connected to the antenna.

In an embodiment, a system comprises means for designating selected stages of a power amplifier as active stages, each active stage comprises a tristate inverter comprises a high side switch and a low side switch connected to the high side switch at a drain node, and a capacitor connected in series with the tristate inverter, means for enabling a high side switch of an active stage in a high side state, means for enabling a low side switch of the active stage in a low side state, and means for disabling the high side switch and the low side switch while in a floating state while transitioning from at least one of the high side state to the low side state or the low side state to the high side state.

In an embodiment, a method comprises designating selected stages of a power amplifier as active stages, each active stage comprises a tristate inverter comprises a high side switch and a low side switch connected to the high side switch at a drain node, and a capacitor connected in series with the tristate inverter, enabling a high side switch of an active stage in a high side state, enabling a low side switch of the active stage in a low side state, and disabling the high side switch and the low side switch while in a floating state while transitioning from at least one of the high side state to the low side state or the low side state to the high side state.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figures 1, 2, 3:
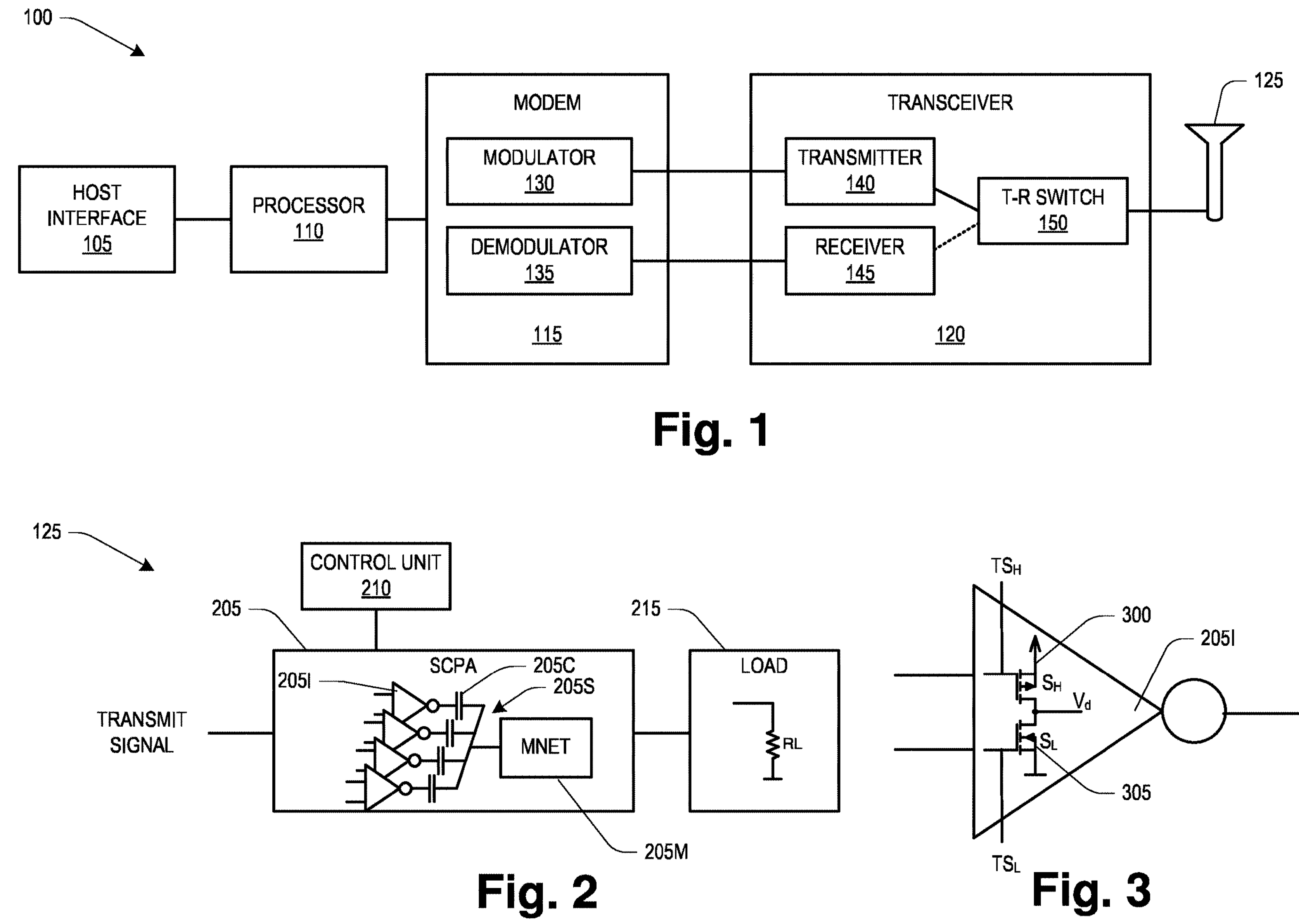
FIG. 1 is a component block diagram of a radio, according to some embodiments.
FIG. 2 is a component block diagram illustrating a transmitter, according to some embodiments.
FIG. 3 is a diagram of a tristate inverter, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

In some embodiments, a transmitter comprises a switched capacitor power amplifier (SCPA) having stages. Each stage includes a tristate inverter and a capacitor. A subset of the stages are enabled, where the number of stages enabled depends on the power requirements for the SCPA. In a high power mode, the subset may include all of the stages. As the power requirements of the SCPA decreases, the number of active stages decreases accordingly. In some embodiments, a tristate inverter includes a high side switch and a low side switch, where the high side switch is enabled during a high side state, the low side switch is enabled during a low side state, and a low state, and neither switch is enabled during a floating state. The floating state allows discharge or charge of the SCPA capacitors, parasitic capacitances, and load capacitance between high side state and low side state transitions to facilitate zero voltage switching and increase the efficiency of the SCPA.

FIG. 1 is a simplified block diagram of a radio 100, according to some embodiments. The radio 100 may support one or more communication protocols, such as a Bluetooth (BT), Bluetooth Low Energy (BLE), Wi-Fi, or some other communication protocol. is the radio comprises a host interface 105, a processor 110, a modem 115, a transceiver 120, and an antenna 125. The radio 100 may communicate with other devices, such as a host computer, using the host interface 105. The modem 115 comprises a modulator 130 and a demodulator 135. The transceiver 120 comprises includes a transmitter 140, a receiver 145, and a transmit-receive (T-R) switch 150. The T-R switch 150 is connected to the antenna 125 at an antenna port 155. The transmitter 140 is configured to transmit signals provided by the modulator 130 and the receiver 145 receives modulated signals and provide the modulated signals to demodulator 135 in the modem 115 for processing. Additionally, the radio 100 may further include a number of band pass filters, amplifiers, multiplexers, demultiplexers, converters, error correction units, analog-to-digital converters (ADCs), digital-to-analog converters (DACs), or other circuits within and through which signals are passed between the antenna 125 and components of the communication system.

The processor 110 implements a software or firmware application that controls communication by the radio 100. The processor 110 includes one or multiple processors, microprocessors, data processors, co-processors, application specific integrated circuits (ASICs), controllers, programmable logic devices, chipsets, field-programmable gate arrays (FPGAs), application specific instruction-set processors (ASIPs), system-on-chips (SoCs), central processing units (CPUs) (e.g., one or multiple cores), microcontrollers, and/or some other type of component that interprets and/or executes instructions and/or data. The processor 110 may be implemented as hardware (e.g., a microprocessor, etc.) or a combination of hardware and software (e.g., a SoC, an ASIC, etc.) and may include one or multiple memories (e.g., cache, random access memory (RAM), dynamic random access memory (DRAM), cache, read only memory (ROM), a programmable read only memory (PROM), a static random access memory (SRAM), a single in-line memory module (SIMM), a dual in-line memory module (DIMM), a flash memory, and/or some other suitable type of memory).

In one embodiment, components of the host interface 105, the processor 110, the modem 115, and the transceiver 120 are integrally formed or incorporated on a single integrated circuit (IC) chip. The antenna 125 can also be integrally formed on the same IC chip, or on a separate chip or substrate packaged in a single multi-chip IC package with the IC chip including the host interface 105, the processor 110, the modem 115, and the transceiver 120. Alternatively, the antenna 125, as well as other components of the radio 100 can be separately implemented on a printed circuit board (PCB) to which the IC chip including the host interface 105, the processor 110, the modem 115, and the transceiver 120 are mounted or attached.

The processor 110 controls the T-R switch 150 to toggle between transmit and receive modes such that the transmitter 140 is connected to the antenna 125 during a transmit mode and the receiver 145 is connected to the antenna 125 during a receive mode. The radio 100 may include fewer components, additional components, different components, and/or a different arrangement of components than those illustrated in FIG. 1.

FIG. 2 is a component block diagram illustrating the transmitter 140, according to some embodiments. In some embodiments, the transmitter 140 comprises a switched capacitor power amplifier (SCPA) 205, and a control unit 210. In FIG. 2, the SCPA 205 is connected to a load 215, such as the T-R switch 135 and the antenna 125. The load 215 represents a resistance, $R_L$. In some embodiments, the load 215 may include an inductance component.

The modulator 130 generates a transmit signal, such as a radio signal encoded with data. For example, the processor 110 may generate or receive data to be transmitted by the radio 100. The processor 110 may provide data to the modem 115, which processes the data in the modulator 130 to generate a transmit signal according to the communication protocol being implemented by the radio 100 to be transmitted using the antenna 125.

In some embodiments, the SCPA 205 modulates/modifies the output power to the required level. The SCPA 205 may provide the required amplitude modulation using a variable gain amplification. In some embodiments, the modem 115 may create the required phase modulation, such as in the case of a polar transmitter, but in some configurations, such as an in-phase/quadrature (IQ) configuration, where the modem 115 provides a static local oscillator (LO) signal, the phase modulation is done by selecting the right amplitude in the I and Q branch.

The SCPA 205 comprises stages 205S, each comprising a tristate inverter 205I and a series capacitor 205C. In some embodiments, the series capacitor 205C has the same capacitance value in each stage 205S. In some embodiments, the series capacitor 205C are weighted across the stages 205S, where the capacitance increases or decreases across the stages 205S. A matching network 205M is provided at the output of the stages 205S. Although not separately illustrated, the SCPA 205 may include parasitic capacitances. The sum of all the capacitors 205C in series with the matching network 205M form a series resonator, allowing only the fundamental tone to pass to the load 215. In some embodiments, the matching network 205M comprises one or more inductors, which may be connected in series with the load 215 ($L_S$), in parallel with the load 215 ($L_P$), both ($L_S$ and $L_P$), or in the form of a transformer. The matching network 205M may include any elements necessary to provide a resultant load impedance sufficient to achieve zero voltage switching operation.

The control unit 210 controls the stages 205S of the SCPA 205 depending on the required power level. For example, during a high power mode all the stages 205S may be operating, during a medium power mode, some of the stages 205S may be disabled, and during a low power mode even more stages 205S may be disabled. In some embodiments, disabled stages 205S are tied to AC ground (i.e., $V_{SS}$ or $V_{DD}$).

Referring to FIG. 3, a diagram of a tristate inverter 205I is provided. The tristate inverter 205I comprises a high side switch 300 and a low side switch 305. The high side switch 300 may be a p-type pull-up transistor and the low side switch 305 may be a n-type pull down transistor. The high side switch 300 is enabled by asserting a $TS_H$ signal during a high side state, the low side switch 305 is enabled by asserting a $TS_L$ signal during a low side state, and neither switch 300, 305 is enabled during a floating state (both $TS_H$ and $TS_L$ are de-asserted). The floating state allows discharge of the capacitors 205C, inherent parasitic capacitances, and any inherent load capacitance between the high side state and the low side state to facilitate zero voltage switching and increase the efficiency of the SCPA 205.

In some embodiments, the control unit 210 generates high side and low side drive signals for operating the switches 300, 305 in the tristate inverters 205I of the active stages 205S. In some embodiments, the control unit 210 is implemented by the processor 110. Additional logic external to a CPU die of the processor 110 may be present, but such additional logic may be considered part of the processor 110.

Figure 4:
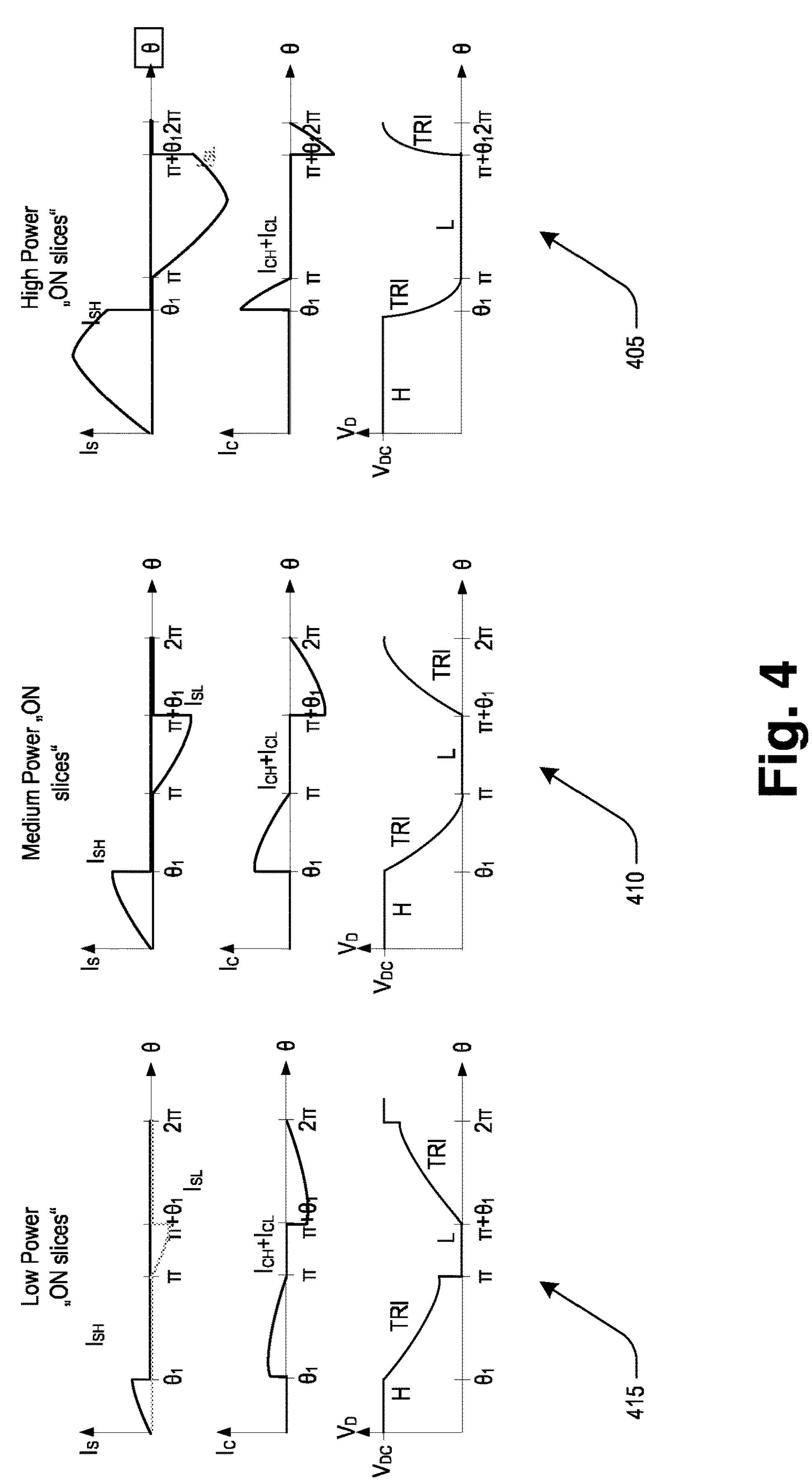
FIG. 4 is a diagram illustrating signals in a switched capacitor power amplifier (SCPA), according to some embodiments.

FIG. 4 is a diagram 400 illustrating signals in the SCPA 205, according to some embodiments. Signals are illustrated for switch current ($I_S$) passing through the high side switch 300 ($I_{SH}$) and the low side switch 305 ($I_{SL}$), parasitic capacitor current ($I_C$) passing through the high side switch 300 ($I_{CH}$) and the low side switch 305 ($I_{CL}$), and drain voltage ($V_D$) of the common drain node connecting the high side switch 300 and the low side switch 305. Plot 405 illustrates $I_S$, $I_C$, and $V_D$ for a high power mode, plot 410 illustrates $I_S$, $I_C$, and $V_D$ for a medium power mode, and plot 415 illustrates $I_S$, $I_C$, and $V_D$ for a low power mode. FIG. 4 illustrates signals for the active stages 205S. The control unit cycles between the high side state, the floating state, the low side state, and the floating state.

In the high power mode shown in the plot 405, the control unit 210 enables the high side switches 300 of the tristate inverters 205I in the active stages 205S to conduct current $I_{SH}$ between 0 and phase $\theta_1$. In the high power mode, all the stages 205S may be active. At phase $\theta_1$, the control unit 210 configures the active tristate inverters 205I in tristate mode (i.e., floating state) and current $I_{CH}+I_{CL}$ flows into the parasitic capacitances, thereby reducing the drain voltage $V_D$. Once the drain voltage reaches the zero switching point, at phase $\pi$, the control unit 210 enables the low side switches 305 of the active stages 205S and current $I_{SL}$ flows through the low side switches 305. At phase $\pi+\theta_1$ the control unit 210 configures the active tristate inverters 205I in tristate mode and current $I_{CH}+I_{CL}$ flows out of the parasitic capacitances, thereby increasing the drain voltage $V_D$ until it reaches the target voltage, $V_{DC}$, of the SCPA 206 at phase $2\pi$. The process repeats for subsequent cycles.

In the medium power mode shown in the plot 410, the control unit 210 enables the high side switches 300 of the tristate inverters 205I of the active stages 205S to conduct current $I_{SH}$ between 0 and phase $\theta_1$. Due to the reduced power requirement, the number of active stages 205S is reduced. The interval between 0 and phase $\theta_1$ is increased compared to the corresponding interval in the high power plot 405 to allow a zero voltage switching condition to be achieved to provide efficiency. Also, the overall voltage and current at the load 215 are reduced. At phase $\theta_1$, the control unit 210 configures the active tristate inverters 205I in tristate mode and current $I_{CH}+I_{CL}$ flows into the parasitic capacitances, thereby reducing the drain voltage $V_D$. Once the drain voltage reaches zero, at phase $\pi$, the control unit 210 enables the low side switches 305 of the active stages 205S and current $I_{SL}$ flows through the low side switches 305. Note that the interval between $\pi+\theta_1$ in the plot 410 may be greater than that in the plot 405 for the high power mode. In some embodiments, the interval between $\pi+\theta_1$ may be the same for implementation simplicity, albeit possibly at the expense of efficiency. At phase $\pi$+01 the control unit 210 configures the active tristate inverters 205I in tristate mode and current $I_{CH}+I_{CL}$ flows out of the parasitic capacitances, thereby increasing the drain voltage $V_D$ increase to the target voltage, $V_{DC}$, at phase $2\pi$. The process repeats for subsequent cycles.

In the low power mode shown in the plot 415, the control unit 210 enables the high side switches 300 of the active tristate inverters 205I to conduct current $I_{SH}$ between 0 and phase $\theta_1$. Due to the reduced power requirement, the number of active stages 205S is further reduced and the interval between 0 and phase $\theta_1$ is longer than the corresponding interval in the medium power plot 410. Also, the overall voltage and current at the load 215 are further reduced. At phase $\theta_1$, the control unit 210 configures the active tristate inverters 205I in tristate mode and current $I_{CH}+I_{CL}$ flows into the parasitic capacitances, thereby reducing the drain voltage $V_D$. Note that the load current is not sufficient to bring the drain voltage to zero at phase $\pi$ when the low side switches 305 are closed after a fixed phase interval. The control unit 210 enables the low side switches 305 of the active stages 205S at phase $\pi$ and current $I_{SL}$ flows through the low side switches 305. Note that the interval between $\pi$+01 in the plot 415 is greater than that in the plot 410 for the medium power mode. At phase $\pi+\theta_1$ the control unit 210 configures the active tristate inverters 205I in tristate mode and current $I_{CH}+I_{CL}$ flows out of the parasitic capacitances, thereby increasing the drain voltage $V_D$ until phase $2\pi$. Note that the drain voltage does not full increase to the target voltage, $V_{DC}$, at phase $2\pi$ when the high side switches 300 are closed after the fixed phase interval. The process repeats for subsequent cycles. In the low power mode, the SCPA 205 does not exhibit zero voltage switching since the load current is insufficient to discharge or charge the drain voltage prior to the switching at the fixed phase intervals, as evident by the step changes in the drain voltage at $\pi$ and $2\pi$. However, since the step changes occur at minimum voltage points near the zero voltage points, the capacitive losses are reduced.

Figures 5, 6:
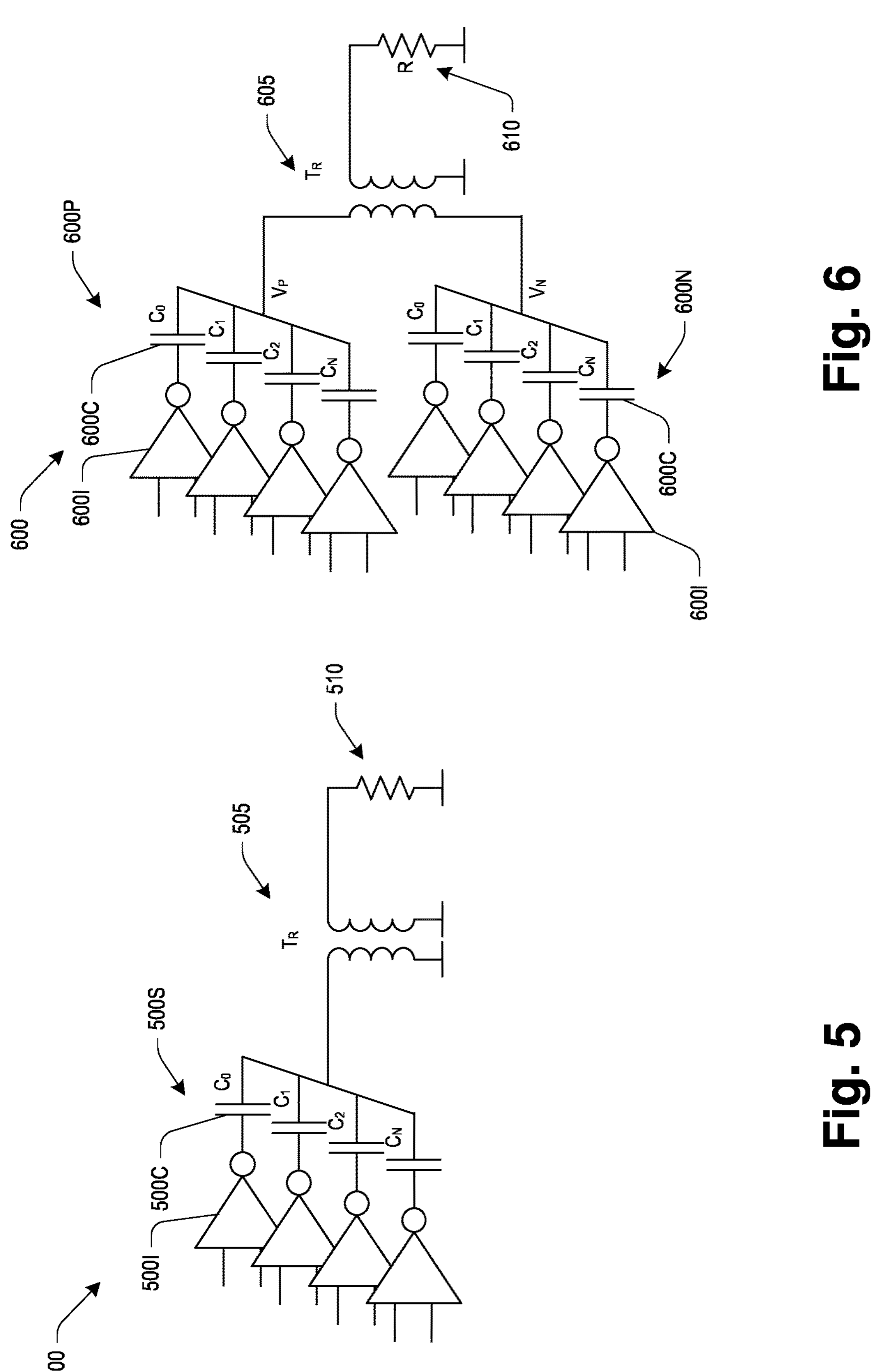
FIG. 5 is a diagram illustrating a single ended SCPA, according to some embodiments.
FIG. 6 is a diagram illustrating a differential SCPA, according to some embodiments.

FIG. 5 is a diagram illustrating a single ended SCPA 500, according to some embodiments. The SCPA 500 comprises stages 500S, each comprising a tristate inverter 500I and a series capacitor 500C. The series capacitors 500C may have the same capacitance values or the capacitances may be weighted across the stages 500S. A matching network 505 is implemented using a transformer at the output of the stages 500S. The sum of all the capacitors 500C in series with the matching network 505 form a series resonator, allowing only the fundamental tone to pass to the load 510. The number of active stages 500S depends on the required power level, and the tristate inverters 500I may be controlled as described above in FIG. 4.

FIG. 6 is a diagram illustrating a differential SCPA 600, according to some embodiments. The SCPA 600 comprises positive differential stages 600P and negative differential stages 600N. Each stage 600N, 600P comprising a tristate inverter 600I and a series capacitor 600C. The series capacitors 600C may have the same capacitance values or the capacitances may be weighted across the stages 600P, 600N. A matching network 605 is implemented using a transformer at the output of the stages 600P, 600N. The sum of all the capacitors 600C in series with the matching network 605 form a series resonator, allowing only the fundamental tone to pass to the load 510. The number of active stages 600P and 600N depends on the required power level, and the tristate inverters 600I may be controlled as described above in FIG. 4.

Figure 7:
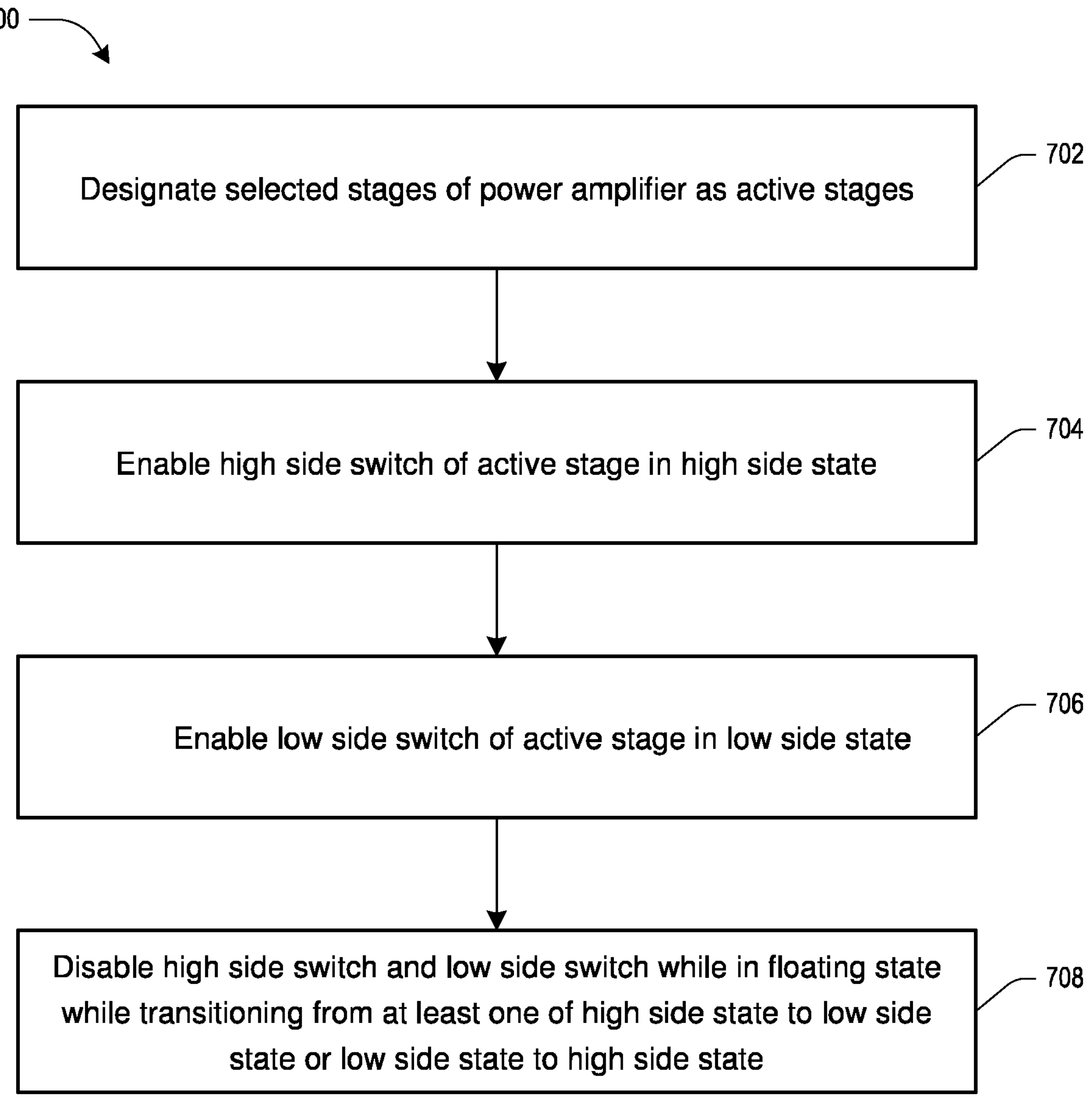
FIG. 7 is an illustration of an example method for controlling switching in an SCPA, according to some embodiments.

FIG. 7 is an illustration of an example method 700 for controlling switching in an SCPA 205, according to some embodiments. At 702, selected stages 205S of a power amplifier 205 are designated as active stages. Each stage 205S comprises a tristate inverter 205I comprising a high side switch 300 and a low side switch 305 connected to the high side switch 300 at a drain node and a capacitor 205C connected in series with the tristate inverter 205I. At 704, the high side switches 300 of the active stages are enabled in a high side state. At 706, the low side switches 305 of the active stages are enabled in a low side state. At 708, the high side switches 300 and the low side switches 305 are disabled in a floating state while transitioning from at least one of the high side state to the low side state or from the low side state to the high side state.

Figure 8:
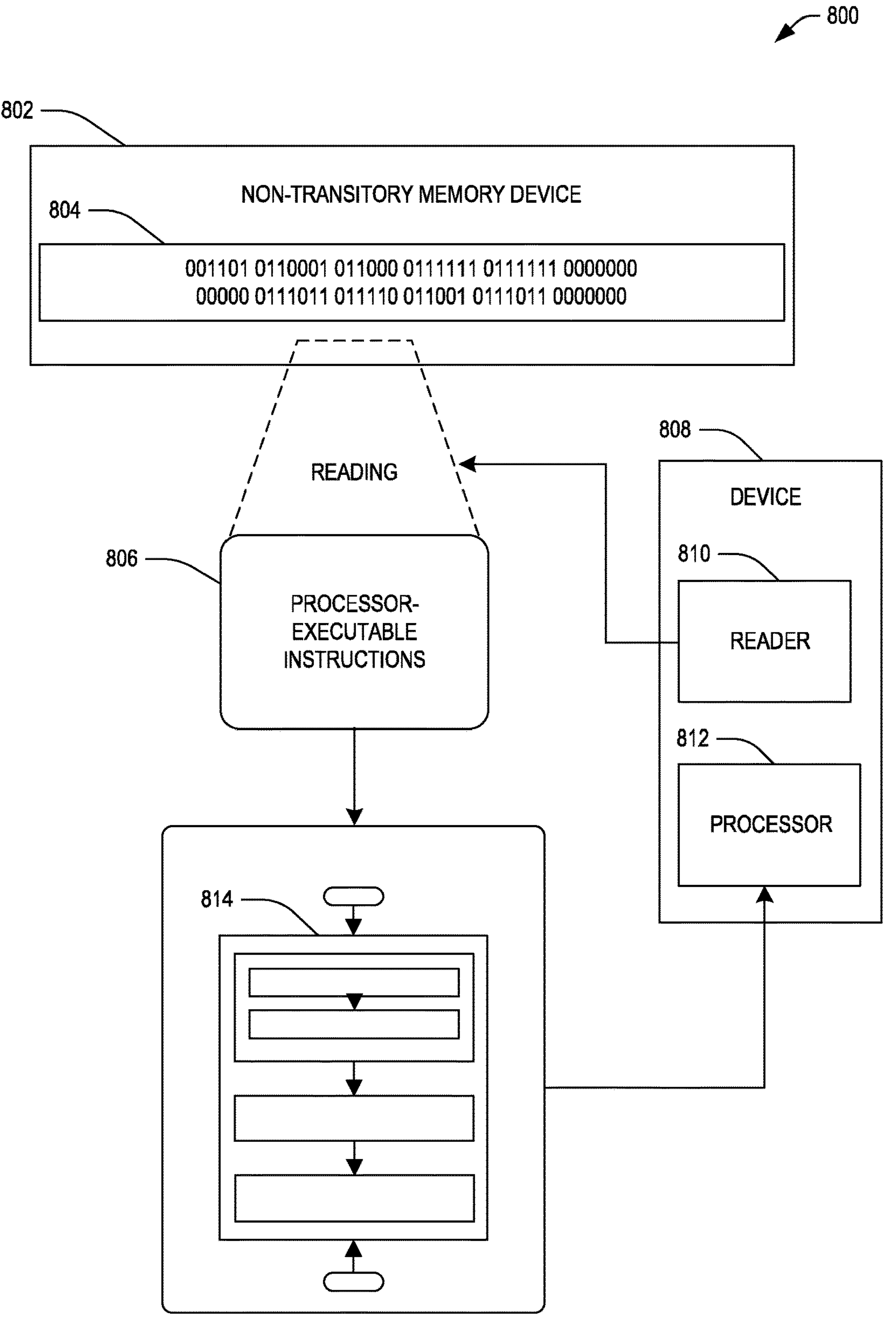
FIG. 8 illustrates an exemplary computer-readable medium, according to some embodiments.

FIG. 8 illustrates an exemplary embodiment 800 of a computer-readable medium 802, according to some embodiments. One or more embodiments involve a computer-readable medium comprising processor-executable instructions configured to implement one or more of the techniques presented herein. The embodiment 800 comprises a non-transitory computer-readable medium 802 (e.g., a CD-R, DVD-R, flash drive, a platter of a hard disk drive, etc.), on which is encoded computer-readable data 804. This computer-readable data 804 in turn comprises a set of processor-executable computer instructions 806 that, when executed by a computing device 808 including a reader 810 for reading the processor-executable computer instructions 806 and a processor 812 for executing the processor-executable computer instructions 806, are configured to facilitate operations according to one or more of the principles set forth herein. In some embodiments, the processor-executable computer instructions 806, when executed, are configured to facilitate performance of a method 814, such as at least some of the aforementioned method(s). In some embodiments, the processor-executable computer instructions 806, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

In an embodiment, a transmitter comprises a power amplifier comprising stages and configured to amplify a transmit signal to generate an amplified signal with an output power according to a number of active stages, each stage comprising a tristate inverter comprises a high side switch and a low side switch connected to the high side switch at a drain node, and a capacitor connected in series with the tristate inverter, and a control unit configured to designate selected stages of the power amplifier as the active stages, enable a high side switch of an active stage in a high side state, enable a low side switch of the active stage in a low side state, and disable the high side switch and the low side switch while in a floating state while transitioning from at least one of the high side state to the low side state or the low side state to the high side state.

In an embodiment, the control unit is configured to cause the high side switch to exit the floating state and enter the low side state after a voltage at the drain node reaches zero.

In an embodiment, the control unit is configured to cause the low side switch to exit the floating state and enter the high side state after a voltage at the drain node reaches a target voltage.

In an embodiment, the control unit is configured to cause at least one of the high side switch or the low side switch to enter the floating state after a predetermined phase interval.

In an embodiment, the control unit is configured to cause at least one of the high side switch or the low side switch to cycle between the high side state, the floating state, and the low side state.

In an embodiment, the power amplifier comprises a matching network connected to the stages.

In an embodiment, the matching network comprises a transformer.

In an embodiment, the stages comprise a first subset of positive differential stages and a second subset of negative differential stages.

In an embodiment, a radio comprises an antenna port, a modem configured to generate a transmit signal, a transmit-receive switch connected to the antenna port, a receiver connected to the transmit-receive switch, and a transmitter connected to the transmit-receive switch and comprising a power amplifier comprising stages and configured to amplify the transmit signal to generate an amplified signal with an output power according to a number of active stages, each stage comprises a tristate inverter comprises a high side switch and a low side switch connected to the high side switch at a drain node, and a capacitor connected in series with the tristate inverter, and a control unit configured to designate selected stages of the power amplifier as the active stages, configure a tristate inverter of an active stage in a high side state for a first phase interval, configure the tristate inverter of the active stage in a floating state for a second phase interval, configure the tristate inverter of the active stage in a low side state for a third phase interval, and configure the tristate inverter of the active stage in the floating state for a fourth phase interval, and a processor configured to control the transmit-receive switch to toggle between a transmit mode, wherein the transmitter is connected to an antenna at the antenna port, and a receive mode, wherein the receiver is connected to the antenna.

In an embodiment, the control unit is configured to start the second phase interval after a voltage at the drain node reaches zero.

In an embodiment, the control unit is configured to end the fourth phase interval after a voltage at the drain node reaches a target voltage.

In an embodiment, the control unit is configured to start the second phase interval after a predetermined phase interval.

In an embodiment, the power amplifier comprises a matching network connected to the stages.

In an embodiment, the stages comprise a first subset of positive differential stages and a second subset of negative differential stages.

In an embodiment, a method comprises designating selected stages of a power amplifier as active stages, each active stage comprises a tristate inverter comprises a high side switch and a low side switch connected to the high side switch at a drain node, and a capacitor connected in series with the tristate inverter, enabling a high side switch of an active stage in a high side state, enabling a low side switch of the active stage in a low side state, and disabling the high side switch and the low side switch while in a floating state while transitioning from at least one of the high side state to the low side state or the low side state to the high side state.

In an embodiment, enabling the low side switch in the low side state comprises enabling the low side switch in the low side state after a voltage at the drain node reaches zero.

In an embodiment, enabling the high side switch in the high side state comprises enabling the high side switch in the high side state after a voltage at the drain node reaches a target voltage.

In an embodiment, enabling the high side switch in the high side state comprises enabling the high side switch in the high side state after a predetermined phase interval.

In an embodiment, enabling the low side switch in the low side state comprises enabling the low side switch in the low side state after a predetermined phase interval.

In an embodiment, the method comprises cycling between the high side state, the floating state, and the low side state.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" and/or the like is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A transmitter, comprising:

a power amplifier comprising stages and configured to amplify a transmit signal to generate an amplified signal with an output power according to a number of active stages, each stage comprising:

a tristate inverter comprising a high side switch and a low side switch connected to the high side switch at a drain node; and a capacitor connected in series with the tristate inverter; and a control unit configured to:

designate selected stages of the power amplifier as the active stages;

enable the high side switch of an active stage in a high side state;

enable the low side switch of the active stage in a low side state; and disable the high side switch and the low side switch while in a floating state while transitioning from at least one of the high side state to the low side state or the low side state to the high side state.

2. The transmitter of claim 1, wherein:

the control unit is configured to cause the high side switch to exit the floating state and enter the low side state after a voltage at the drain node reaches zero.

3. The transmitter of claim 1, wherein:

the control unit is configured to cause the low side switch to exit the floating state and enter the high side state after a voltage at the drain node reaches a target voltage.

4. The transmitter of claim 1, wherein:

the control unit is configured to cause at least one of the high side switch or the low side switch to enter the floating state after a predetermined phase interval.

5. The transmitter of claim 1, wherein:

the control unit is configured to cause at least one of the high side switch or the low side switch to cycle between the high side state, the floating state, and the low side state.

6. The transmitter of claim 1, wherein:

the power amplifier comprises a matching network connected to the stages.

7. The transmitter of claim 6, wherein:

the matching network comprises a transformer.

8. The transmitter of claim 1, wherein:

the stages comprise a first subset of positive differential stages and a second subset of negative differential stages.

9. A radio, comprising:

an antenna port;

a modem configured to generate a transmit signal;

a transmit-receive switch connected to the antenna port;

a receiver connected to the transmit-receive switch; and a transmitter connected to the transmit-receive switch and comprising:

a power amplifier comprising stages and configured to amplify the transmit signal to generate an amplified signal with an output power according to a number of active stages, each stage comprising:

a tristate inverter comprising a high side switch and a low side switch connected to the high side switch at a drain node; and a capacitor connected in series with the tristate inverter; and a control unit configured to:

designate selected stages of the power amplifier as the active stages;

configure the tristate inverter of an active stage in a high side state for a first phase interval;

configure the tristate inverter of the active stage in a floating state for a second phase interval;

configure the tristate inverter of the active stage in a low side state for a third phase interval; and configure the tristate inverter of the active stage in the floating state for a fourth phase interval; and a processor configured to control the transmit-receive switch to toggle between a transmit mode, wherein the transmitter is connected to an antenna at the antenna port, and a receive mode, wherein the receiver is connected to the antenna.

10. The radio of claim 9, wherein:

the control unit is configured to start the second phase interval after a voltage at the drain node reaches zero.

11. The radio of claim 9, wherein:

the control unit is configured to end the fourth phase interval after a voltage at the drain node reaches a target voltage.

12. The radio of claim 9, wherein:

the control unit is configured to start the second phase interval after a predetermined phase interval.

13. The radio of claim 9, wherein:

the power amplifier comprises a matching network connected to the stages.

14. The radio of claim 9, wherein:

the stages comprise a first subset of positive differential stages and a second subset of negative differential stages.

15. A method, comprising:

designating selected stages of a power amplifier as active stages, each active stage comprising:

a tristate inverter comprising a high side switch and a low side switch connected to the high side switch at a drain node; and a capacitor connected in series with the tristate inverter;

enabling the high side switch of an active stage in a high side state;

enabling the low side switch of the active stage in a low side state; and disabling the high side switch and the low side switch while in a floating state while transitioning from at least one of the high side state to the low side state or the low side state to the high side state.

16. The method of claim 15, wherein enabling the low side switch in the low side state comprises:

enabling the low side switch in the low side state after a voltage at the drain node reaches zero.

17. The method of claim 15, wherein enabling the high side switch in the high side state comprises:

enabling the high side switch in the high side state after a voltage at the drain node reaches a target voltage.

18. The method of claim 15, wherein enabling the high side switch in the high side state comprises:

enabling the high side switch in the high side state after a predetermined phase interval.

19. The method of claim 15, wherein enabling the low side switch in the low side state comprises:

enabling the low side switch in the low side state after a predetermined phase interval.

20. The method of claim 15, comprising:

cycling between the high side state, the floating state, and the low side state.

* * * * *